US012218658B2

United States Patent
Ebert et al.

(10) Patent No.: US 12,218,658 B2
(45) Date of Patent: Feb. 4, 2025

(54) SYSTEM AND METHOD FOR IDENTIFYING NON-SWITCHING SEMICONDUCTOR SWITCHES

(71) Applicant: LEONI BORDNETZ-SYSTEME GMBH, Kitzingen (DE)

(72) Inventors: Matthias Ebert, Dettelbach (DE); Wolfgang Koch, Buchbrunn (DE); Martin Roesler, Rosstal (DE)

(73) Assignee: LEONI BORDNETZ-SYSTEME GMBH, Kitzingen (DE)

( * ) Notice: Subject to any disclaimer, the term of this patent is extended or adjusted under 35 U.S.C. 154(b) by 0 days.

(21) Appl. No.: 17/768,732

(22) PCT Filed: Oct. 14, 2020

(86) PCT No.: PCT/EP2020/078905
§ 371 (c)(1),
(2) Date: Apr. 13, 2022

(87) PCT Pub. No.: WO2021/074225
PCT Pub. Date: Apr. 22, 2021

(65) Prior Publication Data
US 2024/0146296 A1  May 2, 2024

(30) Foreign Application Priority Data

Oct. 15, 2019 (DE) ............... 10 2019 127 733.7

(51) Int. Cl.
*G01R 31/26* (2020.01)
*G01R 31/327* (2006.01)
*H03K 17/18* (2006.01)

(52) U.S. Cl.
CPC ......... *H03K 17/18* (2013.01); *G01R 31/2621* (2013.01); *G01R 31/327* (2013.01)

(58) Field of Classification Search
CPC ....... G01R 3/2621; G01R 3/327; H03K 17/18
(Continued)

(56) References Cited

U.S. PATENT DOCUMENTS 6,970,752 B1 * 11/2005 Lim ................. H03M 11/24
                                             381/123
2006/0242348 A1 * 10/2006 Humphrey ......... G06F 13/4291
                                             710/305
(Continued)

FOREIGN PATENT DOCUMENTS

JP     H11150461 A    6/1999
JP     2007336665 A   12/2007
(Continued)

OTHER PUBLICATIONS

JP Examination Report dated Sep. 26, 2023, pp. 1-11.
(Continued)

*Primary Examiner* — William Hernandez
(74) *Attorney, Agent, or Firm* — Tarolli, Sundheim, Covell & Tummino LLP

(57) ABSTRACT

A system and a method for identifying a non-switching semiconductor switch are proposed. The system has a first acquisition component, a second acquisition component and a determination unit. The first acquisition component is designed to acquire a profile of an electrical variable of a first semiconductor switch driven by way of a first drive signal. The second acquisition component is designed to acquire a profile of an electrical variable of a second semiconductor switch driven by way of a second drive signal and connected in parallel with the first semiconductor switch. The determination unit is designed to use the profile of the electrical variable of the first semiconductor switch and the profile of the electrical variable of the second semiconductor switch as a basis for determining an output signal that allows identification of a non-switching semi- (Continued)

Figure 1:
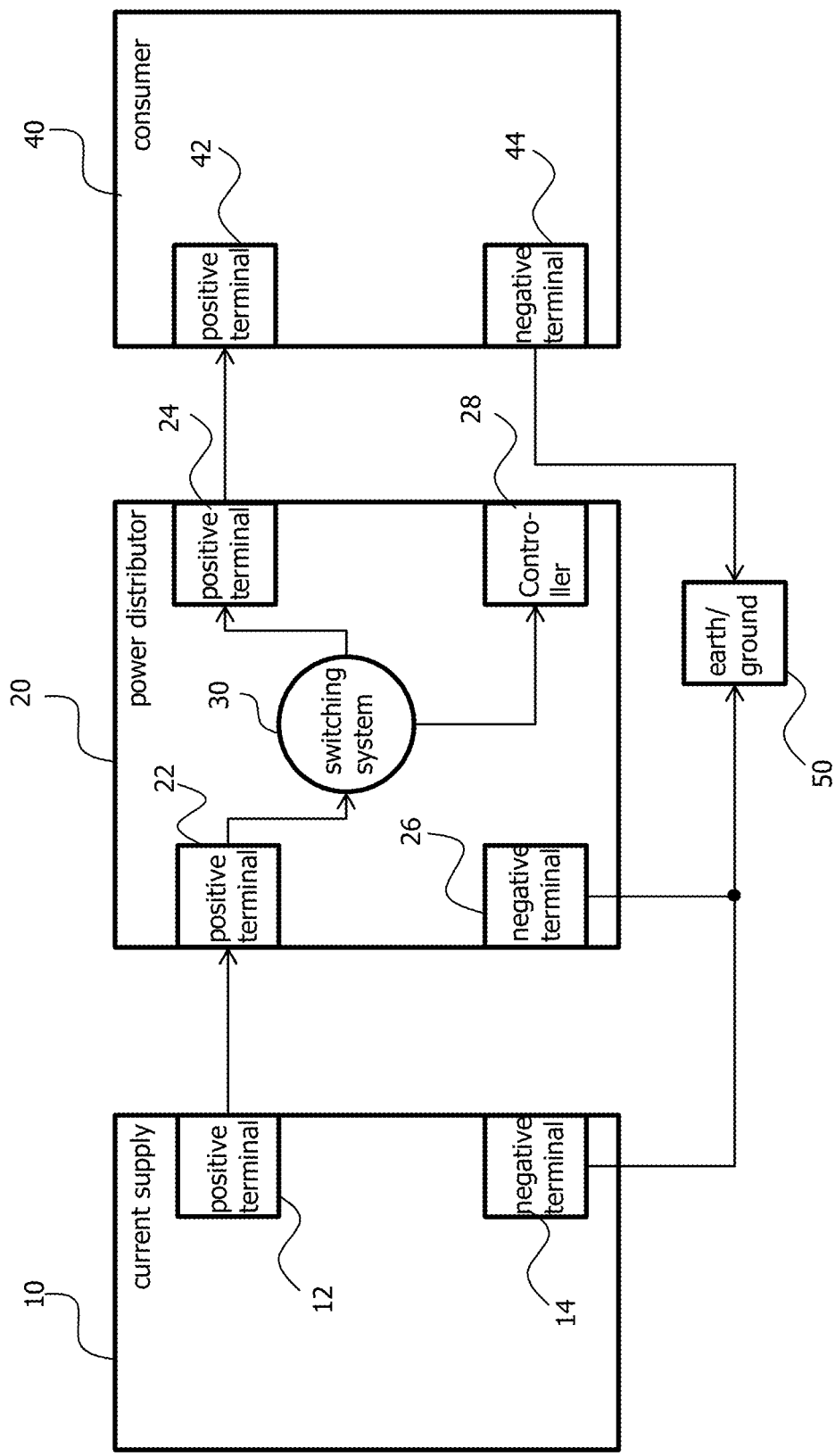

conductor switch for the first semiconductor switch and/or the second semiconductor switch.

11 Claims, 5 Drawing Sheets

(58) Field of Classification Search
    USPC ........ 307/116; 324/500, 537, 762.01, 762.09
    See application file for complete search history.

(56) References Cited

U.S. PATENT DOCUMENTS

| | | | | |
|---|---|---|---|---|
| 2011/0115527 | A1* | 5/2011 | Quinones | ............... H03K 17/18 |
| | | | | 327/77 |
| 2011/0133715 | A1* | 6/2011 | Zushi | ................ H03K 17/0822 |
| | | | | 323/285 |
| 2013/0229186 | A1* | 9/2013 | Shiraishi | ............ G01R 31/3277 |
| | | | | 324/415 |
| 2017/0279443 | A1 | 9/2017 | Morimoto | |
| 2018/0024196 | A1* | 1/2018 | Imura | ...................... H02H 7/00 |
| | | | | 324/762.01 |
| 2022/0404418 | A1* | 12/2022 | Park | .......................... B60L 3/04 |
| 2023/0062064 | A1* | 3/2023 | Uchizawa | .......... G01R 31/3278 |

FOREIGN PATENT DOCUMENTS

| | | |
|---|---|---|
| JP | 2019066364 A | 4/2019 |
| WO | 2010087745 A1 | 8/2010 |

OTHER PUBLICATIONS

International Search Report and Written Opinion issued in connection with corresponding PCT Application No. PCT/EP2020/078905 dated Jan. 13, 2021.

* cited by examiner

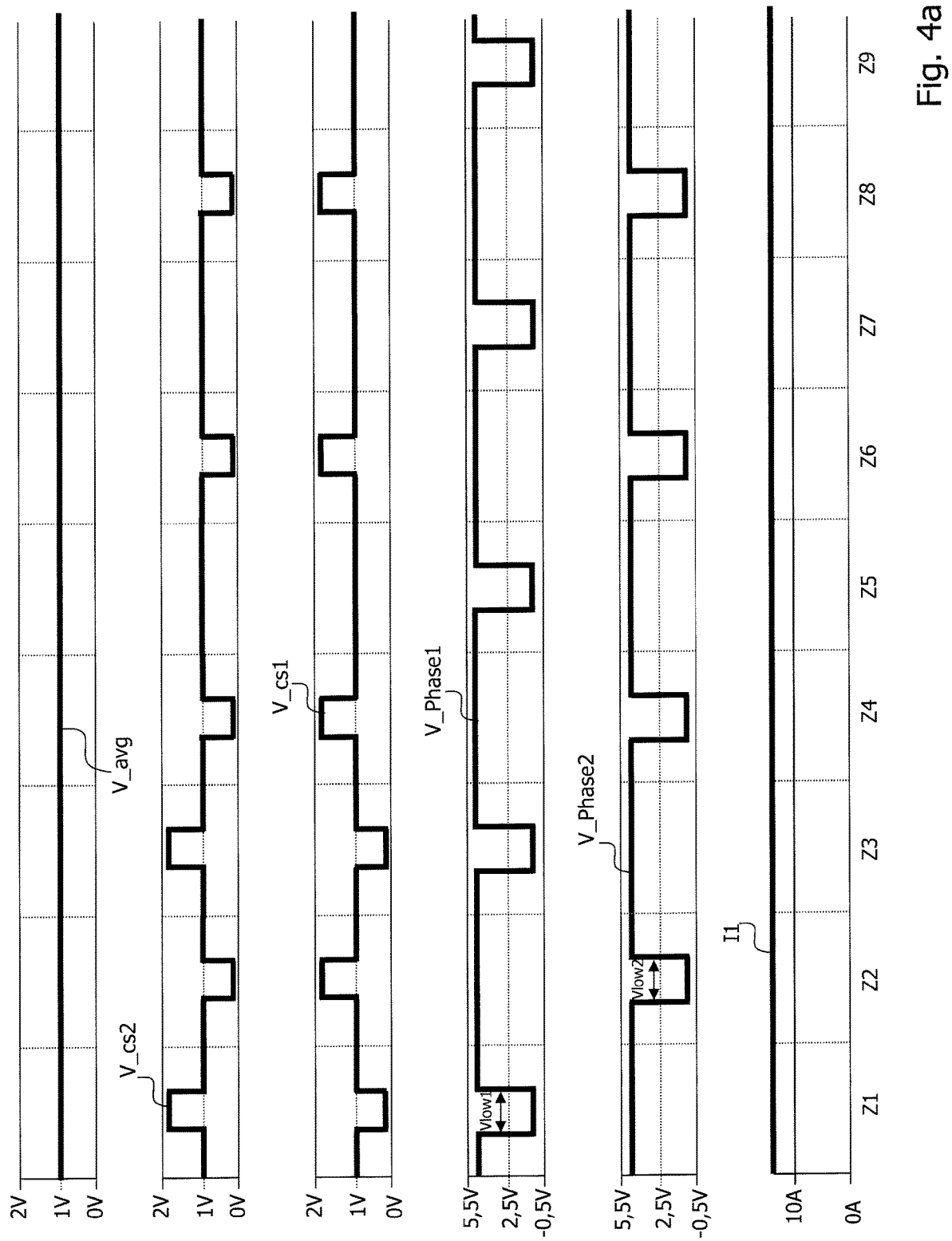

SYSTEM AND METHOD FOR IDENTIFYING NON-SWITCHING SEMICONDUCTOR SWITCHES

RELATED APPLICATIONS

The present invention is a U.S. National Stage under 35 USC 371 patent application, claiming priority to Serial No. PCT/EP2020/078905, filed on Oct. 14, 2020; which claims priority from German Patent Application No. 10 2019 127 733.7 filed on Oct. 15, 2019; the entireties of both are hereby incorporated herein by reference.

The present invention relates generally to the identification of a non-switching semiconductor switch from semiconductor switches connected in parallel. Specifically, the present invention relates to a system and to a method for identifying a non-switching semiconductor switch from at least two semiconductor switches connected in parallel.

In electronic power distributors, in particular in those with high demands in terms of functional safety, it is of particular importance that the state of health (SoH) of the power semiconductors used is known at all times if possible. To this end, it is important to know whether a power semiconductor serving as a switch is capable of reliably switching, in particular switching off, in all circumstances during operation. If this is not possible, the only possibility is to connect a second power semiconductor in series with the power semiconductor. However, this increases the costs, the space requirement and the power loss of the channel. Furthermore, the series connection of a second power semiconductor only statistically reduces the probability of a failure. An actual check and/or diagnosis of a successful switching operation of the semiconductor is possible only by switching off the semiconductor.

DE 43 01 605 C1 discloses a method and an assembly for monitoring the switching on and off of a controllable power semiconductor component in a power electronic circuit. In the case of a control signal for switching on the power semiconductor component, count signals are formed from level changes of the signal supplied to the gate electrode and the level changes at an output electrode during switching of the power semiconductor component. The count signals are added up in a first counter and compared with a predefined count value associated with fault-free operation of the power semiconductor component. A fault is signaled when there is a difference between the sum of the count signals and the predefined count value.

This method and the associated assembly are disadvantageous at least inasmuch as they function only in the case of continually switching switches. In static operation, the system cannot diagnose a fault directly. The method and the assembly of DE 43 01 605 C1 are therefore not sufficiently reliable for identifying faults in particular in static operation.

There is therefore a need for reliable and accurate identification of non-switching semiconductor switches. Identification is to be possible in particular without having to switch off an associated load.

According to a first aspect of the invention, a system for identifying a non-switching semiconductor switch is provided. The system has a first acquisition component, a second acquisition component and a determination unit. The first acquisition component is configured to acquire a profile of an electrical variable of a first semiconductor switch controlled by means of a first control signal. The second acquisition component is configured to acquire a profile of an electrical variable of a second semiconductor switch controlled by means of a second control signal and connected in parallel with the first semiconductor switch. The determination unit is configured to use the profile of the electrical variable of the first semiconductor switch and the profile of the electrical variable of the second semiconductor switch as a basis for determining an output signal that allows/enables a non-switching semiconductor switch of the first semiconductor switch and/or the second semiconductor switch to be identified.

In other words, the determination unit is configured to use the profile (over time) of the electrical variable of the first semiconductor switch and the profile (over time) of the electrical variable of the second semiconductor switch as a basis for determining an output signal that allows/enables a fault in the switching of the first semiconductor switch and/or of the second semiconductor switch to be identified. Accordingly, the system for identifying a non-switching semiconductor switch can alternatively also be referred to as a system for identifying a fault in the switching of a semiconductor switch. The fault can be identified manually, for example, by consideration of the determined output signal or a signal derived from the determined output signal. Alternatively, the fault can be identified in an automated manner by an identification component on the basis of the determined output signal or a signal derived from the determined output signal.

The electrical variable can be an electric current, an electric voltage, an electrical resistance and/or an electric power. The profile is in particular a profile over time.

The first semiconductor switch can assume an opened/open switching state and a closed switching state. The first semiconductor switch can be transferred by means of the first control signal from the open switching state into the closed switching state and vice versa. The second semiconductor switch can assume an opened/open switching state and a closed switching state. The second semiconductor switch can be transferred by means of the second control signal from the open switching state into the closed switching state and vice versa.

The first and/or second semiconductor switch can be part of the system or, as components that are to be regarded as being separate from the system, can be monitored by the system. In other words, the system can have the first and/or second semiconductor switch or can monitor the first and/or second semiconductor switch as external unit(s).

Although mention is made herein of a first and a second semiconductor switch, the invention is not limited to the identification of a non-switching semiconductor switch from exactly two semiconductor switches connected in parallel. For example, three or more than three semiconductor switches can be connected in parallel. In other words, a system for identifying a non-switching semiconductor switch from at least two semiconductor switches connected in parallel is provided according to the first aspect of the invention.

For example, the first semiconductor switch, the second semiconductor switch and at least a third semiconductor switch can be connected in parallel with one another. In this case, the system can identify a non-switching semiconductor switch from the first semiconductor switch, the second semiconductor switch and the at least a third semiconductor switch. The first and/or second and/or at least a third semiconductor switch can be part of the system or, as components that are to be regarded as being separate from the system, can be monitored by the system. In other words, the system can have the first and/or second and/or at least a third semiconductor switch or can monitor the first and/or second and/or at least a third semiconductor switch as external unit(s).

If the first and/or second semiconductor switch can no longer be transferred from an open state into a closed state, a kind of emergency operation can be ensured by means of the at least a third semiconductor switch. Without the at least a third semiconductor switch, a load would be switched off at least for a short time in the above-mentioned case.

The system can be part of a power distribution system, such as, for example, a power distribution system with high demands in terms of functional safety and/or reliability. In power distribution systems generally, and in those with high safety demands in particular, it is important to be able to identify and/or verify the functionality of the semiconductor switches used, in particular without adversely affecting a load, which is preferably connected downstream of a semiconductor switch, during operation.

The first acquisition component can have a first measuring amplifier or be in the form of a first measuring amplifier. The first measuring amplifier can be configured, for example, to determine as the profile of the electrical variable of the first semiconductor switch a profile of an electric current through a first current sense resistor connected in series with the first semiconductor switch. The first measuring amplifier can be configured, for example, as a voltage measuring device for determining as the profile of the electrical variable of the first semiconductor switch a profile of an electric voltage drop across a first current sense resistor connected in series with the first semiconductor switch. The electric current through the first current sense resistor can be deduced from this electric voltage on the basis of a known resistance value. If, for example, an electric current is determined as the electrical variable or derived from the voltage, the electric current through the first current sense resistor corresponds, owing to the series connection, to the electric current through the first semiconductor switch, for example to a drain current through the first semiconductor switch if the first semiconductor switch is in the form of a field-effect transistor.

The second acquisition component can have a second measuring amplifier or be in the form of a second measuring amplifier. The second measuring amplifier can be configured, for example, to determine as the profile of the electrical variable of the second semiconductor switch a profile of an electric current through a second current sense resistor connected in series with the second semiconductor switch. The second measuring amplifier can be configured, for example, as a voltage measuring device for determining as the profile of the electrical variable of the second semiconductor switch a profile of an electric voltage drop across a second current sense resistor connected in series with the second semiconductor switch. The electric current through the second current sense resistor can be deduced from this electric voltage on the basis of a known resistance value. If, for example, an electric current is determined as the electrical variable or derived from the voltage, the electric current through the second current sense resistor corresponds, owing to the series connection, to the electric current through the second semiconductor switch, for example to a drain current through the second semiconductor switch if the second semiconductor switch is in the form of a field-effect transistor.

The first and/or second current sense resistor can be in the form of a shunt or can have a shunt. Accordingly, the first and/or second current sense resistor can be in the form of a low-ohm electric measuring resistor, for example equipped with separate current and voltage terminals, or can have such a measuring resistor. By means of a voltage measuring device connected, for example, in parallel with the shunt, as an example of the first and/or second measuring amplifier, a current which in most cases is negligibly small can be derived.

The output signal determined by the determination unit can allow/enable a fault in the switching of the first semiconductor switch from a closed switching state into an open switching state to be identified. Additionally or alternatively, the output signal determined by the determination unit can allow/enable a fault in the switching of the second semiconductor switch from a closed switching state into an open switching state to be identified. In other words, it is possible to derive from the output signal determined by the determination unit whether the first and/or the second semiconductor switch is or is not able to be (correctly) transferred from a closed switching state into an open switching state.

Furthermore, the output signal determined by the determination unit can allow/enable a fault in the switching of the first semiconductor switch from an open switching state into a closed switching state to be identified. Additionally or alternatively, the output signal determined by the determination unit can allow/enable a fault in the switching of the second semiconductor switch from an open switching state into a closed switching state to be identified. In other words, it is possible to derive from the output signal determined by the determination unit whether the first and/or the second semiconductor switch is or is not able to be (correctly) transferred from an open switching state into a closed switching state.

The system can further have an identification component. The identification component can be configured to identify the fault in the switching of the first semiconductor switch on the basis of the output signal. Additionally or alternatively, the identification component can be configured to identify the fault in the switching of the second semiconductor switch on the basis of the output signal.

The system can further have a time-delay element, also referred to herein as a delay element for short. The delay element can be configured to determine a fault signal by combining the output signal with a switch-on delay. With the aid of the delay element, incorrect diagnoses caused by signal transit times and switching delays can at least be reduced if not entirely prevented.

The determination unit can have a first comparison component and a second comparison component. The first comparison component can be configured to determine a first comparison profile of the electrical variable of the first semiconductor switch with a reference value or reference value profile. The comparison profile can be determined, for example, by comparing the profile of the electrical variable of the first semiconductor switch with a profile of an average from the profile of the electrical variable of the first semiconductor switch and the profile of the electrical variable of the second semiconductor switch. The second comparison component can be configured to determine a second comparison profile of the electrical variable of the second semiconductor switch with a reference value or reference value profile. The second comparison profile can be determined, for example, by comparing the profile of the electrical variable of the second semiconductor switch with the profile of the average from the profile of the electrical variable of the first semiconductor switch and the profile of the electrical variable of the second semiconductor switch.

The first comparison component can have a comparator. Alternatively, the first comparison component can be in the form of a comparator. The second comparison component can have a comparator. Alternatively, the second comparison component can be in the form of a comparator. The comparator can also be referred to as an operational amplifier.

The determination unit can have a first logic component, a second logic component and a third logic component. The first logic component can be configured to determine a first logic signal by combining the first comparison profile with the first control signal. The second logic component can be configured to determine a second logic signal by combining the second comparison profile with the second control signal. The third logic component can be configured to determine the output signal by combining the first logic signal and the second logic signal.

The first logic component can be in the form of an exclusive OR gate (XOR gate). Additionally or alternatively, the second logic component can be in the form of an XOR gate. Additionally or alternatively, the third logic component can be in the form of an OR gate.

The system can have a phase generator. The phase generator can be configured to generate the first control signal. Additionally or alternatively, the phase generator can be configured to generate the second control signal. As a result, the phase generator can be configured to ensure that at least one of the semiconductor switches connected in parallel, that is to say one of the first semiconductor switch and the second semiconductor switch and optionally at least one further semiconductor switch, is switched on.

The first semiconductor switch can be in the form of a power semiconductor/power semiconductor switch. Additionally or alternatively, the second semiconductor switch can be in the form of a power semiconductor/power semiconductor switch. The system can be embedded in a power distributor of a complete system, such as, for example, can be part of a power distributor of a complete system. The complete system can have a current supply (power supply) and at least one consumer. The power distributor can be located between the current supply and the at least one consumer. The power distributor can distribute the current provided by the current supply to the at least one consumer. The first semiconductor switch and/or the second semiconductor switch can be arranged in the power distributor in order to switch on (connect to the current supply) or switch off (disconnect from the current supply) the at least one consumer.

According to a second aspect of the invention, a method for identifying a non-switching semiconductor switch is provided. The method comprises acquiring a profile of an electrical variable of a first semiconductor switch controlled by means of a first control signal. The method further comprises acquiring a profile of an electrical variable of a second semiconductor switch controlled by means of a second control signal and connected in parallel with the first semiconductor switch. The method further comprises determining an output signal on the basis of the profile of the electrical variable of the first semiconductor switch and the profile of the electrical variable of the second semiconductor switch. The output signal allows/enables a non-switching semiconductor switch of the first semiconductor switch and/or the second semiconductor switch (a non-switching semiconductor switch from the first semiconductor switch and/or the second semiconductor switch) to be identified. In other words, the output signal allows/enables a fault in the switching of the first semiconductor switch and/or of the second semiconductor switch to be identified. In other words, a fault in the switching of the first semiconductor switch and/or of the second semiconductor switch can be derived from the output signal. The fault can be derived from the output signal in an automated manner or manually, for example.

Figure 2:
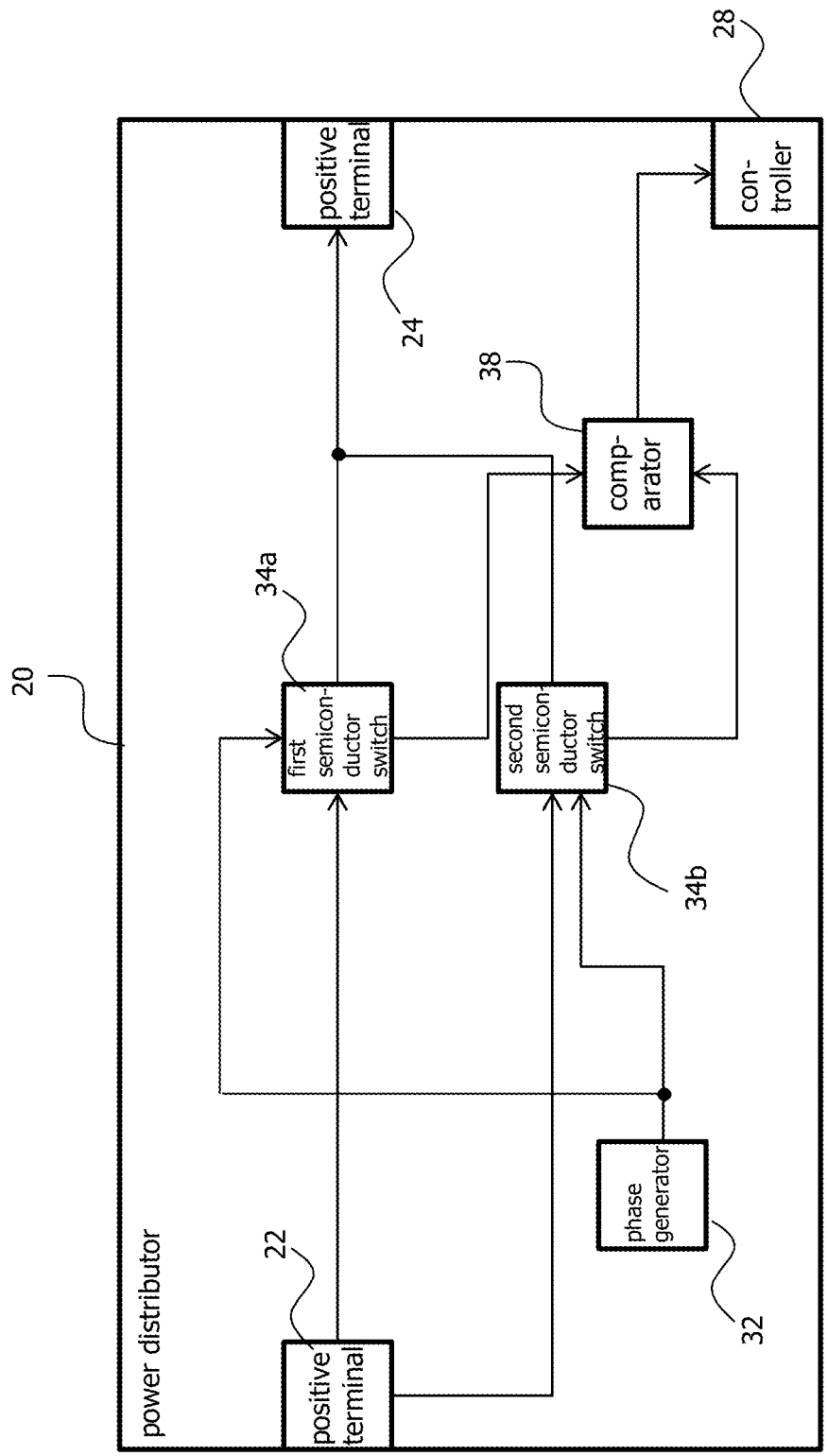
Figure 3:
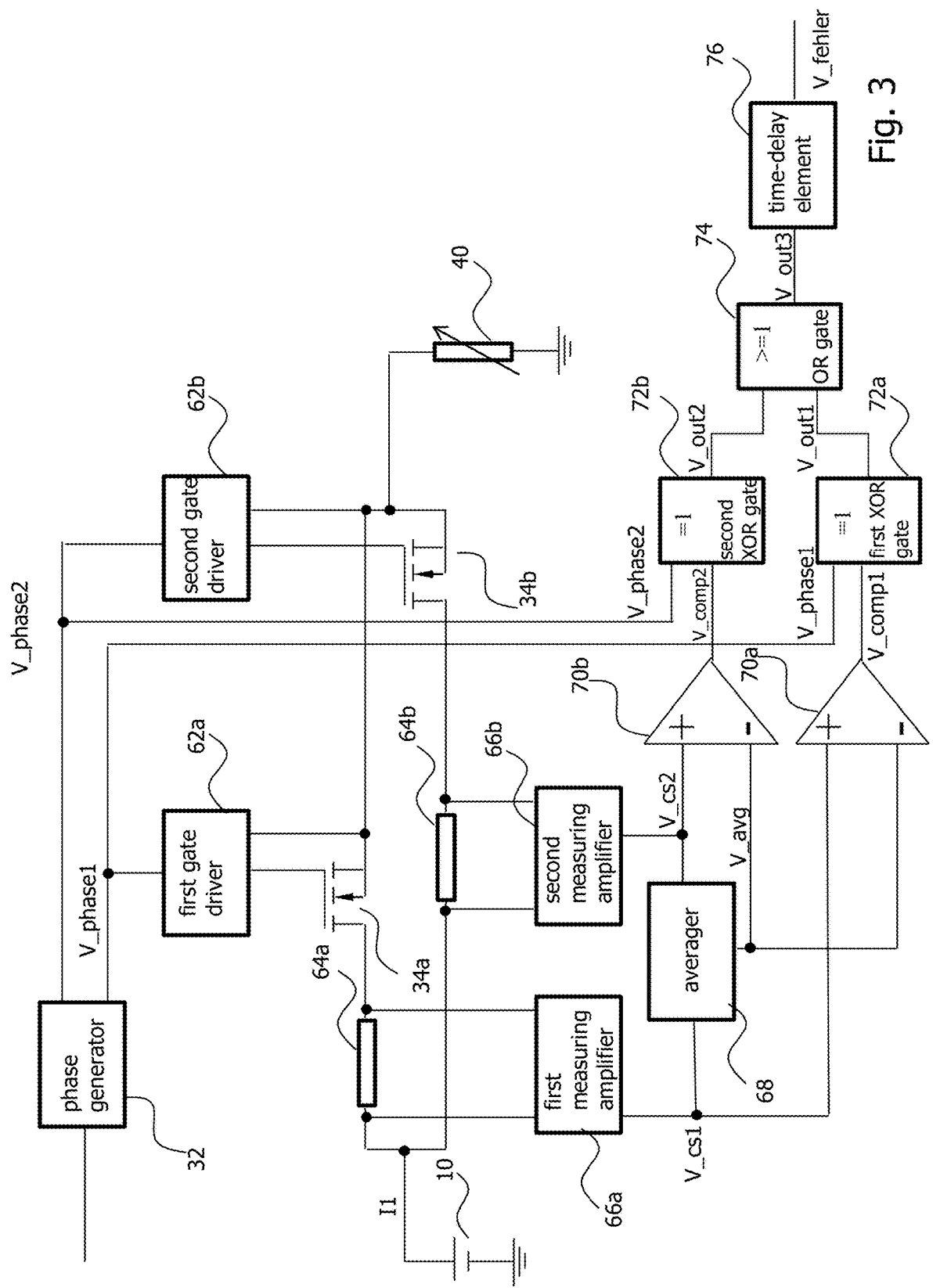

The present disclosure is to be explained further with reference to figures. These figures show, in diagrammatic form:

FIG. 1 a complete system with a current supply, a power distributor and an electric consumer;

FIG. 2 a possible configuration of a power distributor from FIG. 1;

FIG. 3 a possible configuration of a switching system according to an exemplary embodiment which can be used in the power distributor of FIG. 2; and FIGS. 4a, b exemplary signal profiles of electrical variables for use in the system of FIG. 3.

Specific details are set out in the following text, without being limited thereto, in order to provide a complete understanding of the present disclosure. However, it will be clear to a person skilled in the art that the present disclosure can be used in other exemplary embodiments which may differ from the details set out hereinbelow. For example, specific configurations and forms of a system are described in the following text which are not be regarded as limiting.

FIG. 1 shows, in diagrammatic form, a power distribution system having a current supply 10, a power distributor 20 and an electric consumer 40. The current supply 10 has a positive terminal 12 and a negative terminal 14. The power distributor 20 has a positive terminal 22 and a negative terminal 26 on the input side. The power distributor 20 further has a positive terminal 24 on the output side. The power distributor 20 has a switching system 30 with which the consumer 40 can be switched on and off. The switching system 30 has a controller 28. The controller 28 can be a higher-level controller. The electric consumer 40 has a positive terminal 42 and a negative terminal 44.

The negative terminal 14 of the current supply 10, the negative terminal 26 of the power distributor 20 and the negative terminal 44 of the consumer 40 are each connected to earth/ground 50. The current supply 10, the power distributor 20 and the consumer 40 thus have the same reference potential, in the present case, for example, ground/earth 50.

The current supply 10 is connected via its positive terminal 12 to the positive terminal 22 on the input side of the power distributor 20. The power distributor 20 is connected on the output side via its positive terminal 24 on the output side to the electric consumer 40. Although, by way of example, only one consumer 40 is shown, a plurality of electric consumers 40 can thus be connected to the power distributor 20, for example via further positive terminals, not shown in FIG. 1, on the output side of the power distributor 20. The switching system 30 is configured to switch the electric consumer 40 on and off. Where there is a plurality of electric consumers, the system is correspondingly configured to switch each of a plurality of electric consumers on and off. For this purpose, one or more such switching systems can be provided. If switching off is not possible, the switching system 30 provides a corresponding fault message to the controller 28. The power distribution system can be in particular a power distribution system with high demands in terms of safety (and/or high demands in terms of reliability). In such systems, it is all the more important to be able to verify the functionality of the switches used (for switching the consumer 40 on and off).

FIG. 2 shows an exemplary configuration of a power distributor 20 from FIG. 1. The power distributor 20 has a positive terminal 22 on the input side. The power distributor 20 further has a positive terminal 24 on the output side. The power distributor further has a controller 28. The negative terminal of the power distributor from FIG. 1 is not shown in FIG. 2 for the sake of simplicity. In FIG. 2, an exemplary configuration of the switching system 30 from FIG. 1 is shown. According to this example, the switching system 30 has a phase generator 32, a first semiconductor switch 34a, a second semiconductor switch 34b and a comparator 38. The first semiconductor switch 34a and the second semiconductor switch 34b serve to switch the electric consumer 40 on and off. The switch-off functionality in particular is to be monitored for reliability. The first semiconductor switch 34a and the second semiconductor switch 34b are connected in parallel with one another.

The phase generator 32 controls the first semiconductor switch 34a and the second semiconductor switch 34b, for example in each case with the aid of a control signal that is generated. A first acquisition component can acquire a profile of an electrical variable of the first semiconductor switch 34a controlled by means of a first control signal. A second acquisition component can acquire a profile of an electrical variable of the second semiconductor switch 34b controlled by means of a second control signal. The electrical variable can be an electric current or an electric voltage, for example. The first and/or the second acquisition component can be part of the comparator 38, as is provided, for example, in FIG. 2, that is to say according to FIG. 2 the comparator 38 can have the first and/or the second acquisition component. Alternatively, the first and/or the second acquisition component can be configured and arranged in the form of devices that are separate from the comparator 38.

The comparator 38 can, as an example of a determination unit, determine an output signal on the basis of the profile of the electrical variable of the first semiconductor switch 34a and the profile of the electrical variable of the second semiconductor switch 34b. The output signal can allow/enable a fault in the switching of the first semiconductor switch 34a and/or of the second semiconductor switch 34b to be identified. In other words, the acquired output signals of the first semiconductor switch 34a and of the second semiconductor switch 34b can be compared with one another and evaluated in the comparator 38. From the output signals of the first and second semiconductor switches, the comparator 38 generates a comparison signal as the output signal. It can be deduced from this comparison signal whether or not the first semiconductor switch 34a and/or the second semiconductor switch 34b actually switches/switch as intended, in particular switches off/switch off or is/are able to be switched off as intended. If a fault in switching, in particular in switching off, is detected, the controller 28, for example, is informed. The controller 28, as a higher-level body, for example, can take corresponding measures, such as, for example, switch off the electric consumer 40 itself or disconnect it from the power distributor 20 or transfer it into a safer state.

FIG. 3 shows a specific configuration, more precisely a possible circuit in the form of a hardware implementation, of the switching system 30. The switching system 30 has a phase generator 32. The phase generator 32 is configured to generate a first control signal V_phase1 and a second control signal V_phase2. The first control signal V_phase1 is inputted into a first gate driver 62a. The second control signal V_phase2 is inputted into a second gate driver 62b. The first gate driver 62a is connected to the gate terminal of the first semiconductor switch 34a, which in the example of FIG. 3 is in the form of a first MOSFET 34a and is accordingly referred to in the following text as the first MOSFET 34a.

The second gate driver 62b is connected to the gate terminal of the second semiconductor switch 34b, which in the example of FIG. 3 is in the form of a MOSFET 34b and is accordingly referred to as the second MOSFET 34b. The source terminal of the first MOSFET 34a is connected to ground/earth via a variable resistor, which illustrates the load 40 from FIG. 1 in the circuit of FIG. 3 and accordingly is likewise designated by the reference numeral 40. The source terminal of the second MOSFET 34b is connected to ground/earth via the variable resistor. The drain terminal of the first MOSFET 34a is connected to a first current sense resistor 64a. The first MOSFET 34a and the first current sense resistor 64a are connected in series with one another. The drain terminal of the second MOSFET 34b is connected to a second current sense resistor 64b. The second MOSFET 34b and the second current sense resistor 64b are connected in series with one another. A current I1 is generated via an earthed voltage source 10. The voltage source 10 is designated by the reference numeral 10 in FIG. 3 since it can correspond to the current supply 10 of FIG. 1.

The first measuring amplifier 66a and the second measuring amplifier 66b of FIG. 3 can be regarded as a specific implementation of the first acquisition component and the second acquisition component (e.g. of FIG. 2). The first measuring amplifier 66a is configured to acquire an electrical variable at the first current sense resistor 64a. For example, the first measuring amplifier 66a can be configured to acquire a voltage present at the first current sense resistor 64a. Additionally or alternatively, the first measuring amplifier 66a can be configured to acquire an electric current flowing through the first current sense resistor 64a. The second measuring amplifier 66b is configured to acquire an electrical variable at the second current sense resistor 64b. For example, the second measuring amplifier 66b can be configured to acquire a voltage present at the second current sense resistor 64b. Additionally or alternatively, the second measuring amplifier 66b can be configured to acquire an electric current flowing through the second current sense resistor 64b.

The first and second measuring amplifiers 66a, 66b input their acquired/measured values into an averager 68. Furthermore, the profile of the electrical variable measured by the first measuring amplifier 66a is inputted into a positive (non-inverting) input of a first comparator 70a, which is referred to hereinbelow as the operational amplifier 70a. Furthermore, the profile of the electrical variable measured by the second measuring amplifier 66b is inputted into a positive (non-inverting) input of a second comparator 70b, which is referred to hereinbelow as the operational amplifier 70b. Both the negative (inverting) input of the first operational amplifier 70a and the negative (inverting) input of the second operational amplifier 70b are fed by the averager 68.

In the example shown in FIG. 3, the operational amplifiers 70a, 70b are in the form of non-inverting operational amplifiers (non-inverting comparator). In such a non-inverting operational amplifier, the reference voltage, that is to say in the case of FIG. 3 the average, is connected to the inverting input of the operational amplifier. The input signal, here the respective profile of the electrical variable of the semiconductor switches 34a, 34b from the measuring amplifiers 66a, 66b, is in each case connected to the non-inverting input of the operational amplifier. In a non-inverting operational amplifier, a digital 0 (a LOW level) is outputted as the output if the input voltage is smaller than the reference voltage. By contrast, if the input voltage is the same as or larger than the reference voltage, a digital 1 (a HIGH level) is outputted.

Alternatively, it would be possible to provide inverting operational amplifiers in FIG. 3.

The output of the first operational amplifier 70a is connected to a first XOR gate 72a. The first XOR gate 72a thus receives the output signal V_comp1 of the first operational amplifier 70a as a first input variable. The output of the second operational amplifier 70b is connected to a second XOR gate 72b. The second XOR gate 72b thus receives the output signal V_comp2 of the second operational amplifier 70b as a first input variable. The first XOR gate 72a receives the first control signal V_phase1 as a second input variable. The second XOR gate 72b receives the second control signal V_phase2 as a second input variable. The first XOR gate 72a accordingly implements an XOR operation of the output of the first operational amplifier 70a (signal V_comp1) and the first control signal V_phase1. The second XOR gate 72b accordingly implements an XOR operation of the output of the second operational amplifier 70b (signal V_comp2) and the second control signal V_phase2.

The outputs of the first XOR gate 72a (signal V_out1) and of the second XOR gate 72b (signal V_out2) are inputted into an OR gate 74 as input variables. The output of the OR gate 74 is therefore an overlay of the outputs of the first and second XOR gates 72a, 72b.

Problems or faults in the switching of the first MOSFET 34a and/or of the second MOSFET 34b can be deduced from the output signal of the OR gate (signal V_out3).

The identification of a fault can be improved by connecting a time-delay element 76 downstream of the OR gate 74. This can be achieved in that so-called spikes (spikes can be understood as being short peaks, i.e. peaks with a duration below a predefined time threshold) are excluded by the time-delay element 76. The time-delay element 76 has the result that only abnormalities with a duration above a predefined time threshold are identified as faults. The signal outputted by the time— delay element 76 can consequently be referred to as a fault signal V_fehler. In other words, the time-delay element 76 can be referred to as a switch-on delay which has the result that only fault signals above a specific length are evaluated as valid, that is to say as actual/valid fault signals.

With reference to FIG. 3, the comparator from FIG. 2 can be implemented, for example, by the measuring amplifiers 66a, 66b, the averager 68, the operational amplifiers 70a, 70b, the XOR gates 72a, 72b and the OR gate 74 from FIG. 3. Alternative implementations are possible in which one or more of the above-mentioned components are omitted or replaced and/or further components are added. FIG. 3 is thus to be regarded merely as an example of a hardware implementation of the switching system of FIG. 2.

Figure 4B:
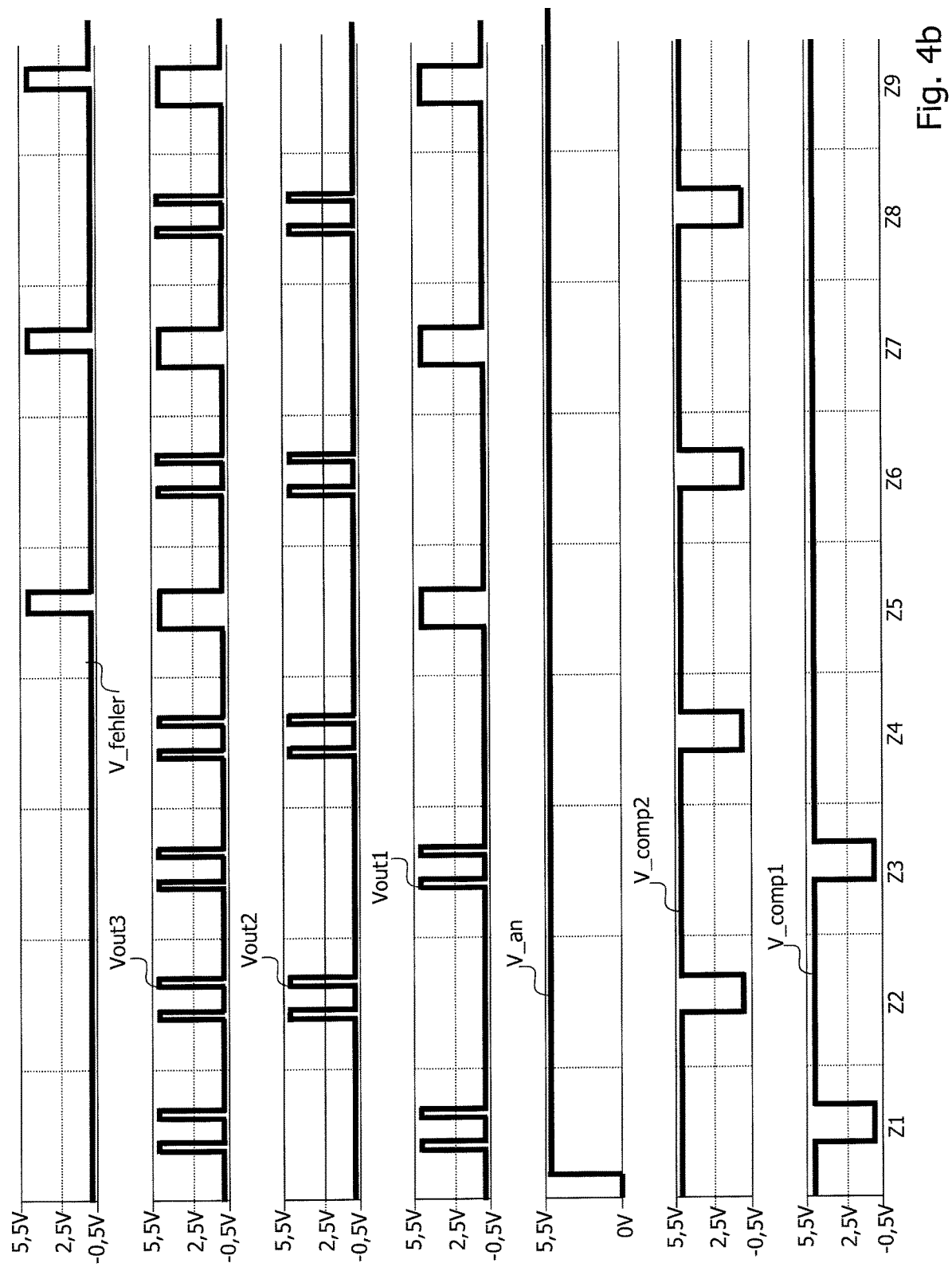

The functioning of the configuration of FIG. 3 will now be described in greater detail with reference to exemplary signal profiles from FIGS. 4a and 4b. In FIGS. 4a and 4b, the signal profiles are in each case shown over time. The ordinate in each case shows the respective electrical variable, for example current or voltage, and the abscissa shows the time. The abscissa is divided into a plurality of regions (more specifically nine regions), which are referred to herein as time slots Z1 to Z9.

In the example, the two MOSFETS 34a, 34b are in the form of self-locking n-channel MOSFETS. Therefore, the MOSFETS 34a, 34b are in a closed state and conduct current when the voltage between the gate and the source exceeds a threshold. The threshold is in each case below the 5V taken as the maximum values of the control signals V_phase1, V_phase2 in FIGS. 4a and 4b.

As can be seen in relation to the exemplary signal profiles in FIGS. 4a and 4b, the two control signals V_phase1, V_phase2 begin in the first time slot Z1 with a value of approximately 5V. This corresponds to a high level, also referred to as HIGH (digital 1). Owing to the HIGH level of the control signals V_phase1, V_phase2, a voltage that exceeds the threshold of the MOSFETS 34a, 34b is present between the gate and the source of the first MOSFET 34a and between the gate and the source of the second MOSFET 34b. Both MOSFETS 34a, 34b are therefore in a closed state.

In the exemplary configuration of FIG. 3, the total resistance from the first current sense resistor 64a and the first MOSFET 34a corresponds at least approximately exactly to the total resistance from the second current sense resistor 64b and the second MOSFET 34b. If both MOSFETS 34a, 34b are closed, the current I1 is therefore divided at least approximately equally over the parallel circuit of the two MOSFETS 34a, 34b. Therefore, at least approximately I1/2 flows through both branches of the circuit. A first measuring amplifier 66a can measure the current through the first current sense resistor 64a directly, for example. A second measuring amplifier 66b can measure the current through the second current sense resistor 64b directly, for example. Alternatively, the first measuring amplifier 66a can measure the voltage drop across the first current sense resistor 64a. Furthermore, the second measuring amplifier 66b can measure the voltage drop across the second current sense resistor 64b. Regardless of the measuring method, the first measuring amplifier 66a and the second measuring amplifier 66b determine an at least approximately equal electrical variable if both the first MOSFET 34a and the second MOSFET 34b are closed.

After a time, the first control signal V_phase1 is set to a voltage of approximately 0V for a time period Vlow1 in the first time slot Z1. This corresponds to a low level, also referred to as LOW level (digital 0). In this case, the voltage present between the gate and the source of the first MOSFET 34a is, if at all, only very low and is below the threshold of the first MOSFET 34a. The MOSFET 34a therefore changes to an open state. During the same time period Vlow1 of the first time slot Z1, the second control signal V_phase2 continues to be at a HIGH level. The second MOSFET 34b is therefore still closed. Since the first MOSFET 34a is open in the first time period Vlow1 of the first time slot Z1 and the second MOSFET 34b is closed in the first time period Vlow1 of the first time slot Z1, the current I1 flows at least almost entirely via the branch of the parallel circuit of the two MOSFETs in which the second MOSFET 34b is located. The first measuring amplifier 64a therefore determines a value of at least approximately 0 as the electrical variable. The second measuring amplifier 64b at the same time determines a value which corresponds at least approximately to the current I1 or the multiplication of the current I1 and the current sense resistor 64b. This corresponds to twice the average. The first measuring amplifier 64a determines in the same time period Vlow1 a value of at least approximately 0 as the electrical variable.

The second control signal is switched to a low level, LOW level (digital 0), in a second time slot Z2 for a time period Vlow2. In this case, the voltage present between the gate and the source of the second MOSFET 34b is, if at all, only very low and is below the threshold of the second MOSFET 34b. The MOSFET 34b therefore changes to an open state. During the same time period Vlow2 of the second time slot Z2, the first control signal V_phase1 is at a HIGH level. The first MOSFET 34a is therefore closed. Since the first MOS- FET 34a is closed in the time period Vlow2 of the second time slot Z2 and the second MOSFET 34b is open in the time period Vlow2 of the second time slot Z2, the current I1 flows at least almost entirely via the branch of the parallel circuit of the two MOSFETs in which the first MOSFET 34a is located. The first measuring amplifier 64a therefore determines as the electrical variable a value which corresponds at least approximately to the current I1 or the multiplication of the current I1 and the current sense resistor 64a. This corresponds to twice the average. The second measuring amplifier 64b determines in the same time period Vlow2 a value of at least approximately 0 as the electrical variable.

If the first MOSFET 34a and the second MOSFET 34b are each in a closed state, the two measuring amplifiers 66a, 66b, as described, determine an at least approximately equal value for the measured electrical variable. The averager 68 forms the average from the measured variables. In the case of equal values, the average of the electrical variable corresponds at least approximately to the measured value itself. Therefore, the operational amplifier 70a does not determine any difference between the variable V_cs1 measured by the first measuring amplifier 66a and the average V_avg from the averager 68 and accordingly outputs a HIGH level (a 1). Furthermore, the operational amplifier 70b does not determine any difference between the variable V_cs2 measured by the second measuring amplifier 66b and the average V_avg from the averager 68 and accordingly outputs a HIGH level (a 1).

If the first MOSFET 34a is in an open state and the second MOSFET 34b is in a closed state (see e.g. the time period Vlow1 in the first time slot Z1 and the third time slot Z3), the first measuring amplifier 66a determines a minimum value of 0 and the second measuring amplifier 66b determines the maximum value. The averager 68 forms the average from the measured variables. Therefore, the first operational amplifier 70a determines that the value of the electrical output variable V_cs1 of the first measuring amplifier 66a is below the average and accordingly outputs a LOW level (digital 0). Furthermore, the operational amplifier 70b determines that the value of the electrical output variable V_cs2 of the second measuring amplifier 66b is not below the average from the averager 68 and accordingly outputs a HIGH level (a 1) (see signal V_comp1).

If the first MOSFET 34a is in a closed state and the second MOSFET 34b is in an open state (see e.g. the time period Vlow2 in the second time slot Z2 and the fourth time slot Z4), the first measuring amplifier 66a determines a maximum value and the second measuring amplifier 66b determines a minimum value of 0. The averager 68 forms the average from the measured variables. Therefore, the operational amplifier 70a determines that the value of the electrical output variable V_cs1 of the first measuring amplifier 66a is not below the average and accordingly outputs a HIGH level (digital 1). Furthermore, the operational amplifier 70b determines that the value of the electrical output variable V_cs2 of the second measuring amplifier 66b is below the average from the averager 68 and accordingly outputs a LOW level (digital 0) (see signal V_comp2).

Therefore, when the first MOSFET 34a is open, a double peak caused by transit time delays and/or switching delays is obtained as the output variable V_out1 of the first XOR gate 72a at approximately the time level of the LOW level of the first control signal V_phase1, that is to say approximately at the level of the time period Vlow1 in the first time slot Z2 and in the third time slot Z3. Therefore, when the second MOSFET 34b is open, a double peak is obtained as the output variable V_out2 of the second XOR gate 72b at approximately the time level of the LOW level of the second control signal V_phase2, that is to say approximately at the level of the time period Vlow2 in the second time slot Z2 and in the fourth time slot Z4 (and likewise in the sixth time slot Z6 and the eighth time slot Z8). The outputs of the first XOR gate 72a and of the second XOR gate 72b are inputted as input variables into an OR gate 74. The output of the OR gate 74 is therefore an overlay of the outputs of the first XOR gate 72a and the second XOR gate 72b. The output signal V_out3 of the OR gate 74 therefore shows a double peak, which in each case indicates opening of the first or second MOSFET 34a, 34b, in the first time slot Z1 to the fourth time slot Z4 (and likewise in the sixth time slot Z6 and the eighth time slot Z8).

If it is now assumed, by way of example, that in the fifth time slot Z5, seventh time slot Z7 and ninth time slot Z9 the first MOSFET 34a does not open correctly even though the first control signal V_phase1 assumes a LOW level in the time period Vlow1, the MOSFET 34a remains in the closed state in the fifth time slot Z5, seventh time slot Z7 and ninth time slot Z9. As explained, the current I1 is in this case divided at least approximately equally over the parallel circuit of the MOSFETS 34a, 34b. A current with a value of at least approximately I1/2 therefore flows through each of the MOSFETS 34a, 34b and thus through each current sense resistor 64a, 64b. The measuring amplifiers 66a, 66b therefore determine an at least approximately equal value. The two operational amplifiers 70a, 70b therefore do not determine a difference between the measured values of the measuring amplifiers 66a, 66b and the average. In the fifth time slot Z5, seventh time slot Z7 and ninth time slot Z9, the two operational amplifiers 70a, 70b therefore output a HIGH level for the signals V_comp1, V_comp2 even during the time period Vlow1. The XOR operation of the output of the first operational amplifier 72a with the first control signal V_phase1 therefore leads to a (single) HIGH level approximately during the time period Vlow1 of the fifth time slot Z5 (V_out1), not to a double peak. The XOR operation of the output of the second operational amplifier 72b with the second control signal V_phase2 leads to a LOW level (V_out2). The OR operation of the outputs of the two XOR gates 72a, 72b therefore leads in the fifth time slot Z5, seventh time slot Z7 and ninth time slot Z9 in each case to a (single) peak (at least approximately at the level of the time period Vlow1 in the fifth time slot Z5, seventh time slot Z7 and ninth time slot Z9). This one peak (instead of a double peak caused by transit time delays and/or switching delays with a smaller width of each peak) in the output signal of the OR gate 74 (V_out3) therefore indicates a fault.

The identification of a fault can be improved by connecting a time delay, which in some cases is referred to in the following text as a time-delay element 76, downstream of the OR gate 74. The time delay has the result that only peaks with a duration above a predefined time threshold are identified as faults. The duration of the double peaks in the first time slot Z1 to the fourth time slot Z4 (and likewise in the sixth time slot Z6 and eighth time slot Z8) is in each case below the time threshold. Therefore, the output of the time-delay element 76 outputs a LOW level (see signal V_fehler). By contrast, the duration of the peaks in the fifth time slot Z5, seventh time slot Z7 and ninth time slot Z9 is above the time threshold. The time-delay element 76 therefore outputs a HIGH level (see signal V_fehler) for a specific time in the fifth time slot Z5, seventh time slot Z7 and ninth time slot Z9.

According to a specific implementation of the time delay, the time-delay element 76 can be in the form of a switch-on delay or can effect a switch-on delay. In this case, the time-delay element 76 can effect time-delayed switching on or can switch on with a time delay, for example. The time delay can correspond at least to the magnitude (from the point of view of time) of one of the pulses of the double pulses of the signals Vout1, Vout2, Vout3 or can be above that magnitude. As a result, the respective pulses of these double pulses are suppressed or faded out and only the longer pulses (i.e. the pulses with a width greater than the time delay or greater than the width of each peak of the double peak) are outputted, in each case shortened by the magnitude of the time delay in the fault signal V_fehler. This can be seen in FIG. 4b, in which a valid fault signal V_fehler is shown. In the signal V_fehler, the rising edge of a fault pulse is always offset or shortened relative to the rising edge of a long peak by the magnitude of the switch-on delay, for example in the signal Vout3 (i.e. shortened at least by the width of a pulse of a double pulse/double peak). By contrast, the falling edge of the pulse of the fault signal V_fehler falls at the same time as the corresponding pulse in the signal Vout3, since it is only a switch-on delay and not a switch-off delay. This concerns all time slots with faults, i.e. Z5, Z7 and Z9. By contrast, the pulses of each double pulse are suppressed by the switch-on delay. These are ultimately not actual/valid fault pulses.

As a result, the output signal V_fehler of the time-delay element 76 only shows a peak if there is a fault in the switching of one of the MOSFETS 64a, 64b. By contrast, transit time delays are suppressed. The output of the time delay 76 can therefore be referred to as a fault signal V_fehler. By means of an identification circuit, the peaks in the fault signal V_fehler can be identified automatically. On the basis of the peaks and the control signals, the identification circuit can immediately conclude which of the two MOSFETS 34a, 34b has not switched correctly. Therefore, not only can the fault be identified promptly, but the component in question can be replaced or another response to eliminate the fault can be taken promptly.

FIGS. 3, 4a and 4b can be summarized as follows. In the circuit shown in FIG. 3, two power semiconductors (MOSFET) 34a, 34b are connected in parallel with one another together with in each case a current sense resistor (shunt) 64a, 64b. The two power semiconductors 34a, 34b are alternately switched off and on by a logic. In the ideal state (fault-free state), at least one power semiconductor 34a, 34b is always switched on. Via the two shunts 64a, 64b, the current through each of the two parallel paths is measured via a current measuring amplifier 66a, 66b for each path. If both MOSFETs 34a, 34b are on (closed), approximately the same current (in each case half the load current I1) is measured via both measuring amplifiers 66a, 66b. As soon as one of the two MOSFETs 34a, 34b switches off, the entire load current I1 flows via one of the two paths while the other path no longer conducts any current. However, the average of the two currents remains the same. By means of two comparators (operational amplifiers) 70a, 70b, the output signal V_cs1, V_cs2 of the two current measuring amplifiers 66a, 66b is compared with the average and converted into digital signals by the comparators 70a, 70b. The signal shape of the comparators 70a, 70b thus corresponds roughly to the signal sequence V_phase1, V_phase2 with which the respective MOSFET 34a, 34b is controlled. By comparing the control signal V_phase1, V_phase2 of the MOSFETs 34a, 34b with the output signal V_comp1, V_comp2 of the respective comparator 70a, 70b by means of exclusive OR operation (XOR operation), it is possible to detect whether the MOSFET 34a, 34b actually switches off. The two XOR signals V_out1, V_out2 combined by XOR of the two MOSFETs 34a, 34b are then combined by an OR operation into a signal V_out3 and filtered by a switch-on delay 76. The switch-on delay 76 is advantageous for suppressing incorrect diagnoses triggered by signal transit times and/or switching delays. There is obtained as the output signal V_fehler a pulse sequence which corresponds approximately (although shortened) to the control pulses of the defective MOSFET 34a, 34b. The output signal V_fehler of the switch-on delay 76 can then be read in and processed by a higher-level controller (not shown, but see controller 28 in FIG. 2). Alternatively, the pulse sequence can be converted into a static value by a storage element (not shown).

Although the description of the exemplary embodiments of FIGS. 2 to 4b referred to identifying whether the first semiconductor switch 34a and/or the second semiconductor switch 34b is correctly transferred from a closed state into an open state, it can correspondingly be identified from the signal profiles whether the first semiconductor switch 34a and/or the second semiconductor switch 34b is correctly transferred from an open state into a closed state.

The identification of a non-switching semiconductor switch of the first and/or second semiconductor switch 34a, 34b permits the use of simple and inexpensive components and it is possible to dispense with a series connection of in each case a further semiconductor switch for redundancy purposes.

Although reference is always made in the description of the exemplary embodiments of FIGS. 2 to 4b to a first semiconductor switch 34a and a second semiconductor switch 34b, these exemplary embodiments and the invention in general are not limited to exactly two semiconductor switches connected in parallel. Three or more than three semiconductor switches can likewise be provided. In summary, therefore, at least two semiconductor switches can be present, and at least one non-switching semiconductor switch can be identified from these at least two semiconductor switches connected in parallel.

An advantage of connecting at least a third semiconductor switch in parallel with the first semiconductor switch 34a and the second semiconductor switch 34b will now be described with reference to FIGS. 3 to 4b without the at least a third semiconductor switch being shown in the figures.

As described, in the first time slot Z1 the first semiconductor switch 34a is opened if the first control signal V_phase1 assumes a LOW level in the time period Vlow1. After the time period Vlow1 has passed, the first control signal V_phase1 again assumes a HIGH level. The first semiconductor switch 34a would in this case close again. However, if the first semiconductor switch 34a is defective, the first semiconductor switch 34a remains open, that is to say it no longer closes even though the first control signal V_phase1 has assumed a HIGH level again. As described, the second semiconductor switch 34b is open in the second time slot Z2 during the time period Vlow2 since the second control signal assumes a LOW level during the time period Vlow2. Consequently, during the time period Vlow2, both the first semiconductor switch 34a is open (since it no longer closes even though it should actually be closed) and the second semiconductor switch 34b is open (owing to the LOW level of the second control signal V_phase2). Thus, the load switches off (briefly) during the time period Vlow2 in time slots Z2, Z4, Z6, Z8.

By contrast, if at least a third semiconductor switch is connected in parallel, this third semiconductor switch—if switched correctly—can permit a kind of emergency operation. This is because the at least a third semiconductor switch will be in its closed state during the time period Vlow2 with the aid of at least a third control signal, which assumes a HIGH level during the time period Vlow2. Accordingly, the load is not disconnected from the system and the current supply and is consequently not switched off.

The invention claimed is:

1. A system for identifying a non-switching semiconductor switch, wherein the system has:
    a first acquisition component which is configured to acquire a profile of an electrical variable of a first semiconductor switch controlled by means of a first control signal;
    a second acquisition component which is configured to acquire a profile of an electrical variable of a second semiconductor switch controlled by means of a second control signal and connected in parallel with the first semiconductor switch;
    a determination unit which is configured to use the profile of the electrical variable of the first semiconductor switch and the profile of the electrical variable of the second semiconductor switch as a basis for determining an output signal which allows a non-switching semiconductor switch of the first semiconductor switch and/or of the second semiconductor switch to be identified,
    wherein the first acquisition component has a first measuring amplifier or is in the form of a first measuring amplifier, wherein the first measuring amplifier is configured, for example, to determine as the profile of the electrical variable of the first semiconductor switch a profile of an electric current through a first current sense resistor connected in series with the first semiconductor switch, and/or
    wherein the second acquisition component has a second measuring amplifier or is in the form of a second measuring amplifier, wherein the second measuring amplifier is configured, for example, to determine as the profile of the electrical variable of the second semiconductor switch a profile of an electric current through a second current sense resistor connected in series with the second semiconductor switch.

2. The system as claimed in claim 1, wherein the output signal determined by the determination unit allows a fault in the switching of the first semiconductor switch and/or of the second semiconductor switch from a closed state into an open state to be identified.

3. The system as claimed in claim 1, wherein the system further has an identification component which is configured to identify the fault in the switching of the first semiconductor switch and/or of the second semiconductor switch on the basis of the output signal.

4. The system as claimed in claim 1, wherein the system further has a delay element which is configured to determine a fault signal by combining the output signal with a switch-on delay.

5. The system as claimed in claim 1, wherein the determination unit has:
    a first comparison component which is configured to determine a first comparison profile by comparing the profile of the electrical variable of the first semiconductor switch with a profile of an average of the profile of the electrical variable of the first semiconductor switch and the profile of the electrical variable of the second semiconductor switch; and
    a second comparison component which is configured to determine a second comparison profile by comparing the profile of the electrical variable of the second semiconductor switch with the profile of the average of the profile of the electrical variable of the first semiconductor switch and the profile of the electrical variable of the second semiconductor switch.

6. The system as claimed in claim 5, wherein
    the first comparison component has a comparator or is in the form of a comparator; and/or
    the second comparison component has a comparator or is in the form of a comparator.

7. The system as claimed in claim 5, wherein the determination unit has:
    a first logic component which is configured to determine a first logic signal by combining the first comparison profile with the first control signal;
    a second logic component which is configured to determine a second logic signal by combining the second comparison profile with the second control signal;
    a third logic component which is configured to determine the output signal by combining the first logic signal with the second logic signal.

8. The system as claimed in claim 7, wherein
    the first logic component is in the form of an XOR gate; and/or
    the second logic component is in the form of an XOR gate; and/or
    the third logic component is in the form of an OR gate.

9. The system as claimed in claim 1, wherein the system further has a phase generator which is configured to generate the first control signal and/or the second control signal.

10. The system as claimed in claim 1, wherein the first semiconductor switch and/or the second semiconductor switch is/are in the form of a power semiconductor; and/or wherein the system has:
    the first semiconductor switch; and/or
    the second semiconductor switch connected in parallel with the first semiconductor switch; and/or
    at least a third semiconductor switch connected in parallel with the first and second semiconductor switches.

11. A method for identifying a non-switching semiconductor switch, wherein the method comprises:
    acquiring a profile of an electrical variable of a first semiconductor switch controlled by means of a first control signal;
    acquiring a profile of an electrical variable of a second semiconductor switch controlled by means of a second control signal and connected in parallel with the first semiconductor switch;
    determining an output signal on the basis of the profile of the electrical variable of the first semiconductor switch and the profile of the electrical variable of the second semiconductor switch, wherein the output signal allows a non-switching semiconductor switch of the first semiconductor switch and/or of the second semiconductor switch to be identified,
    wherein a first acquisition component has a first measuring amplifier or is in the form of a first measuring amplifier, wherein the first measuring amplifier is configured, for example, to determine as the profile of the electrical variable of the first semiconductor switch a profile of an electric current through a first current sense resistor connected in series with the first semiconductor switch, and/or
    wherein a second acquisition component has a second measuring amplifier or is in the form of a second measuring amplifier, wherein the second measuring amplifier is configured, for example, to determine as the profile of the electrical variable of the second semiconductor switch a profile of an electric current through a second current sense resistor connected in series with the second semiconductor switch.

\* \* \* \* \*